(12) United States Patent
Van Deursen et al.

(10) Patent No.: US 12,209,979 B2
(45) Date of Patent: Jan. 28, 2025

(54) FABRICATING THIN FILM LIQUID CELLS

(71) Applicant: UNIVERSITEIT LEIDEN, Leiden (NL)

(72) Inventors: Pauline Marthe Gerardina Van Deursen, Leiden (NL); Gregory Fabrice Schneider, Leiden (NL); Alexander Kros, Leiden (NL); Viorica Tudor, Leiden (NL)

(73) Assignee: UNIVERSITEIT LEIDEN, Leiden (NL)

( * ) Notice: Subject to any disclaimer, the term of this patent is extended or adjusted under 35 U.S.C. 154(b) by 395 days.

(21) Appl. No.: 17/786,238

(22) PCT Filed: Dec. 21, 2020

(86) PCT No.: PCT/EP2020/087551
§ 371 (c)(1),
(2) Date: Jun. 16, 2022

(87) PCT Pub. No.: WO2021/123458
PCT Pub. Date: Jun. 24, 2021

(65) Prior Publication Data
US 2023/0025535 A1  Jan. 26, 2023

(30) Foreign Application Priority Data
Dec. 19, 2019 (EP) .................................. 19218275

(51) Int. Cl.
*G01N 23/2202* (2018.01)
*G01N 1/28* (2006.01)
*H01J 37/20* (2006.01)

(52) U.S. Cl.
CPC ....... *G01N 23/2202* (2013.01); *G01N 1/2813* (2013.01); *H01J 37/20* (2013.01); *G01N 2223/03* (2013.01); *G01N 2223/637* (2013.01); *H01J 2237/2003* (2013.01); *H01J 2237/201* (2013.01); *H01J 2237/2802* (2013.01)

(58) Field of Classification Search
CPC ............. G01N 23/2202; G01N 1/2813; G01N 2223/03; G01N 2223/637; H01J 37/20; H01J 2237/2003; H01J 2237/201; H01J 2237/2802
See application file for complete search history.

(56) References Cited

FOREIGN PATENT DOCUMENTS

| CN | 106769287 A | 5/2017 |
|---|---|---|
| EP | 3062082 A1 | 8/2016 |

OTHER PUBLICATIONS

International Search Report dated Mar. 4, 2021, for International Patent Application No. PCT/EP2020/087551.

*Primary Examiner* — Nicole M Ippolito
*Assistant Examiner* — Hanway Chang
(74) *Attorney, Agent, or Firm* — KARCESKI IP LAW, PLLC

(57) ABSTRACT

A thin film liquid cell suitable for transmission electron microscopy at room temperature is fabricated as follows. A thin film floating on a liquid is prepared. A droplet of the liquid with the thin film floating thereon is transferred to a support by means of a loop. The loop carries the droplet and the droplet carries the thin film during this transfer. Sufficient liquid from the droplet on the support is removed to form the thin film liquid cell.

15 Claims, 5 Drawing Sheets

FABRICATING THIN FILM LIQUID CELLS

CROSS-REFERENCE TO RELATED APPLICATION(S)

This is a National Stage Entry into the United States Patent and Trademark Office from International Patent Application No. PCT/EP2020/087551, filed on Dec. 21, 2020, which claims priority to European Patent Application No. 19218275.6, filed on Dec. 19, 2019, the entire contents of both of which are incorporated herein by reference.

FIELD OF THE INVENTION

The present disclosure relates to methods and systems of producing one or more substantially 2 dimensional film liquid cells, in particular graphene liquid cells.

BACKGROUND OF THE INVENTION

Graphene liquid cells (GLCs) are femtoliter-sized pockets of water confined between two films of graphene. These ultrathin graphene-water structures offer a nanoscale environment for water-based processes, enabling real-time transmission electron microscopy (TEM) at room temperature. While the development of liquid cells brought about atomic resolution imaging of metallic nanoparticle growth, visualizing processes of organic matter remains highly challenging. Organic molecules, made up of low atomic number elements, are weaker electron scatterers than for instance metal atoms, yielding lower contrast in electron images. Moreover, the interaction of the electron beam with biomolecules, organic molecules, and all liquids causes radiolysis of chemical bonds in samples. The electron dose used for imaging organic materials is therefore limited, generally resulting in a low signal-to-noise ratio.

Conventionally, silicon-based liquid cells confine water between two SiN nano-membranes. The electron pathway through both the SiN and water induces significant electron scattering.

Graphene, on the other hand, is a single atomic film that causes minimal background electron scattering. Moreover, graphene is a thermal and electrical conductor that prevents beam-induced damage by facilitating fast energy dissipation. As an advantage of graphene in electron imaging of soft matter an order of magnitude higher spatial resolution in graphene-coated TEM specimen compared to specimen without graphene, fixated by plunge-freezing has been documented.

Therefore, GLCs offer the prospect of the high-resolution, dynamic imaging of biological processes, for example protein function and lipid membrane fusion. The first GLC studies of bio-organic systems at room temperature include SKBR3 breast cancer cells, the $H_3N_2$ influenza virus, microtubulines and polystyrene chains in water resolved at the level of individual molecules.

Beyond these first successes, demonstration of reproducible data acquisition is desired as a next step towards application to specific case studies in life sciences. Currently, poor reproducibility of GLC fabrication methods is found delaying this development. A desire for a fabrication procedure is that graphene is transferred without the use of polymer support films, as transfer polymers inevitably leave trace contaminations visible during TEM imaging. A recent review lists current methods for assembling GLCs on TEM grids but falls short of giving clarity on the efficiency of each method towards GLC fabrication: M. Textor and N. De Jonge, Nano Lett. 2018 (18): 3313.

Some GLC assembly methods are known. E.g., a method comprises the sandwiching of water between two TEM grids each carrying graphene on a porous support layer. As graphene is supported through the sample assembly procedure, this method has the largest chance of retaining graphene integrity, albeit at the cost of losing graphene flexibility. Another drawback lies in the double support layers that are sandwiched together, obscuring a large part of the imaging area by support material.

Other methods amount to placing a top graphene film initially floating on water (or an aqueous specimen solution/dispersion) from the water surface onto a graphene-coated TEM grid. Such assembly can be achieved in two ways. Firstly, the top graphene film can be scooped from the liquid surface from below onto the grid, i.e. scooping the TEM grid through the water. Hence, this method is referred to as the scooping method. This scooping method induces mechanical stress to the free-floating graphene film and has to date only been demonstrated using multilayer graphene. Secondly, a TEM grid can be placed on top of the floating graphene film. Hence, this approach is referred to as the 'touch-down' method. In the touch-down method, the specimen liquid can be added as a droplet to the grid, or be sprayed as micro-droplets onto either graphene film. The latter approach has been shown to render large areas of intact graphene.

It is noted that most often, multilayer graphene is used in these methods, because of its superior stability. Both multilayer graphene or defect-free single crystals of graphene has been shown to increase success rates, but the availability of these materials is limited. Moreover, single film graphene may be preferred over multilayer graphene, as the latter is more rigid and often contaminated by preparation procedures in which single graphene films are stacked using polymer transfer.

SUMMARY OF THE INVENTION

In view of the foregoing, herein are presented fabricating methods for 2 dimensional film liquid cells, in particular GLCs.

A method of fabricating a thin film liquid cell in accordance with the invention is defined.

A method of imaging a sample comprising a thin film liquid cell obtained by such a method of fabricating a thin film liquid cell also is defined.

Still further, a thin film liquid cell suitable for transmission electron microscopy at room temperature is defined.

A thin film may be a substantially 2-dimensional film such as a single-molecule/atom-film film, e.g., a graphene film in particular a graphene liquid cell, more in particular comprising the method as described and/or specified herein elsewhere. In an embodiment, a method of fabricating a thin film liquid cell may comprise:
  providing a support,
  preparing a substantially 2-dimensional thin film, in particular a graphene film, and
  arranging the thin film on the support with a liquid; and
  forming one or more thin film liquid cells containing an amount of the liquid;
  wherein the method further comprises providing the liquid, preferably prior to forming the thin film liquid cells, with a luminescent substance, in particular a luminescent dye such as a fluorescent dye.

The luminescence may possibly be one or more of fluorescence, phosphorescence and/or multiphoton luminescence, and preferably be so under light at a wavelength in a range of 5,000-200 nm, in particular 1,100-300 nm, more in particular 800-350 nm, e.g., 550-400 nm. The shorter the wavelength, the more intense the luminescence may be and/or the shorter the luminescence wavelength may be which may facilitate detection of the luminescence.

Suitable 2-dimensional films may be single-molecule/atom-thickness films and/or monolayer film or few-layer films, e.g., films of hexagonal boron nitride (h-BN), dichalcogenides, and single-molecule/atom-layer films e.g., graphene films. The support may be or comprise any suitable support structure such as electron microscopy supports, e.g., TEM-grids (which may generally be gold), SiN chips etc. In the following the graphene film-based water-containing liquid cells are used for explaining the present concepts but as exemplary materials only; this disclosure should neither be held restricted to graphene as the thin film material nor to water as the liquid contained in the liquid cells, nor to TEM-grids as a support.

The method may further comprise providing the support with a target thin film, in particular a substantially 2-dimensional film such as a single-molecule/atom-film film e.g., a graphene film and arranging the thin film on the target thin film with a liquid.

Thus, the thin film may be supported on a target thin film, preferably of the same material as the thin film considered, which may improve structural integrity of the thin film and GLCs produced with it. Thus, GLCs may be produced between the thin film and the target thin film, facilitating fabrication of numerous GLCs.

The method may further comprise: providing a sample comprising a substrate provided with a thin film layer and/or a thin film precursor; supporting the sample on the liquid surface of a liquid in a container; removing the substrate in and/or by the liquid, e.g., dissolving the substrate, and forming the said thin film supported on the liquid surface. The thin film layer and the thin film may preferably be the same and substantially unchanged apart from the presence/absence of the substrate, such as in case of graphene on copper being etched away. However, any suitable kind of physical transformation and/or chemical transformation may be allowed to occur or be caused to occur to transform the thin film layer into the thin film, e.g., evaporation of a substance from the thin film layer, reaction of two or more components and/or curing of the thin film layer. Such manner has proven to be a reliable manner of forming substantially 2-dimensional thin films.

During at least part of removing the substrate in and/or by the liquid, a floating frame may be provided to stabilize the graphene.

The method may further comprise transferring at least part of the thin film onto the support, using a loop supporting a liquid droplet in turn supporting the thin film. Such Loop Assisted Transfer ("LAT") proves a reliable manner for transferring thin films from one configuration to another.

In the method, providing the liquid with a luminescent substance may comprise providing liquid supporting the sample on a liquid surface thereof with the luminescent substance. Also or additionally, in case of transferring the thin film using LAT, the method may comprise providing the liquid of the liquid droplet with the luminescent substance, and/or it may comprise providing the liquid droplet from the liquid provided with the luminescent substance.

In any of these options, the luminescent substance may efficiently be included in the amount of liquid contained in the liquid cell upon forming the liquid cell.

Herewith also a method is provided, which may suitably be combined with any other method described herein, which method comprises:
capturing light optical image data associated with a light optical aspect of at least part of a structure comprising the thin film, in particular at least one of transmittance, refractance, reflectance, and luminescence; and
capturing electron optical image data associated with an electron beam optical aspect of at least part of a structure comprising the thin film and comparing at least part of said captured light optical image data and electron optical image data.

Typically, the light optical image data may be captured based on optical microscopy and comprise transmission, reflection and luminescence such as fluorescence. Typically, the electron optical image data may be captured based on transmission electron microscopy and comprise transmission and/or absorption data.

The method, in particular the step of comparing the respective image data, may comprise one or more of: correlating the respective image data; mapping the respective image data with respect to each other and/or with respect to at least part of the structure, which may comprise identifying one or more corresponding structures in the respective image data, scaling at least part of the image data; providing an image comprising, or being representative of, both said light optical image data and said electron optical image data; comparing the image data as a function of time; identifying and/or locating one or more thin film liquid cells; and identifying one or more properties of one or more thin film liquid cells.

The method may further comprise providing comparison data associated with comparing at least part of said captured light optical image data and electron optical image data and using the comparison data for manipulating and/or studying a thin film liquid cell.

Herewith in an aspect also a method is provided, which may suitably be combined with any other method described herein, which comprises: a method of fabricating one or more substantially 2-dimensional film liquid cells, in particular graphene liquid cells, comprising:
providing a support,
preparing a substantially 2-dimensional thin film, in particular a graphene film, and
arranging the thin film on the support with a liquid;
wherein the method further comprises bending or folding a first portion of the thin film with respect to a second portion of the thin film such that a volume containing an amount of the liquid is formed between the first and second portions of the thin film, closing the volume containing the amount of the liquid thus forming an enclosed thin film liquid cell.

This method facilitates preparation of 2-dimensional thin film liquid cells, in particular graphene liquid cells. By forming the volume containing the liquid by bending or folding, amounts of liquid may readily and reliably be captured. Moreover, efforts to maintain the thin film flat may be obviated. The method may provide comparably large numbers of liquid cells and liquid cells manufactured with such method prove to be surprisingly robust and of suitable sizes for many experiments. The bending or folding may comprise one or more of plying, creasing, wrinkling, and folding over at least part of the thin film to provide the first and second portions of the thin film.

The method may further comprise causing and/or establishing mutual contact of the first and second portions of the thin film around the volume and/or the amount of liquid.

Thus a volume for containing an amount of liquid is defined and/or the amount of liquid is retained. The first and second portions of thin film may be portions of different films. However, handling of a single thin film may suffice for preparation of a specimen for study in case the first and second portions of the thin film are portions of on thin film.

Associated with the foregoing. in another aspect, herewith a thin film liquid cell specimen is provided comprising a substrate, in particular a TEM grid, wherein the thin film in particular may be a substantially 2-dimensional film such as a single-molecule/atom-film film, e.g., a graphene film and/or the thin film liquid cell in particular being a graphene liquid cell, containing an amount of liquid between the first and second portions of the thin film, which may comprise a luminescent substance in the amount of liquid of the thin film liquid cell. This facilitates detection and study of the liquid cell.

The specimen may comprise a support for supporting the thin film liquid cell, the support being luminescent and/or comprising a luminescent substance. This may facilitate identifying and/or recognising structures in the specimen. It may be desired that luminescence of the support and the liquid cells have different characteristics, e.g., regarding one or more of brightness, wavelength (colour), and luminescent process (fluorescence vs. phosphorescence) for ease of distinction.

The specimen, with or without luminescent substance, may comprise a thin film liquid cell formed by bending or folding a first portion of a thin film with respect to a second portion of the thin film forming an enclosed thin film liquid cell providing a volume. Such specimen may in particular provide one or more relatively large and/or robust liquid cells.

Associated with the foregoing. in another aspect, herewith a system for studying thin film liquid cells is provided, in particular thin film liquid cells of a thin film liquid cell specimen as specified herein and/or thin film liquid cells fabricated according to any method specified herein, wherein the system comprises a support provided with one or more thin films to provide the one or more thin film liquid cells, in particular a thin film liquid cell specimen as disclosed herein elsewhere;
a light optical image forming device, e.g., a camera and/or a microscope;
an electron optical image forming device, e.g., a transmission electron microscope; and
one or more sources for causing luminescence of at least part of the support provided with one or more thin films.

The system facilitates detection and study of the thin film liquid cells.

For further facilitating detection and study, the system may comprise a controller for comparing:

light optical image data captured using the light optical image forming device and being associated with a light optical aspect of at least part of a structure comprising the thin film; and
electron optical image data captured using the electron optical image forming device and being associated with an electron beam optical aspect of at least part of the structure comprising the thin film.

In the thin film liquid cell specimen and/or the system, at least part of the thin film and/or the support may comprise a marker and/or be provided with a marker for providing a reference for facilitating comparing light optical image data with electron optical image data.

Further, an efficient and reproducible approach is provided for fabrication of GLCs by loop-assisted transfer (LAT) of graphene. In the following, the LAT approach is compared to two known GLC fabrication methods: the touch-down method and the grid sandwich method. These three methods (LAT, touch-down and grid sandwich), require no lithographic substrate preparation or liquid handling equipment. However, at least in the LAT approach this may be provided. Moreover, in the methods a specimen liquid can be added as a macroscopic droplet, requiring no large volumes or micro-spraying. However, at least in the LAT approach this may be provided. Accessibility of a GLC manufacturing technique is strongly desired for widespread adaptation of GLCs in in biomaterials and microbiological research, where micro- and nanofabrication are not commonplace.

In addition, for obtaining a representative count of the GLCs on each grid, a method of correlated light-electron microscopy (CLEM) is provided.

Herein a systematic comparison of fabrication methods and detailed description of GLC formation mechanisms is provided, indicating improvements for fabricating GLC, which may promote implementation of GLCs, e.g., in high resolution TEM imaging of room temperature specimen.

Graphene liquid cells (GLCs) for transmission electron microscopy (TEM) enable high-resolution, real-time imaging of dynamic processes in water. Large-scale implementation, however, is prevented by major difficulties in reproducing GLC fabrication. Here, a high-yield method to fabricate GLCs is presented as an example. The GLCs may be formed under graphene of areas of graphene, possibly continuous areas, which may be millimeter-sized, facilitating efficient GLC formation on a TEM grid as an exemplary support. Other supports may be used as well. Additionally, location of GLCs on the grid or support using correlated light-electron microscopy (CLEM) is provided, which may reduce beam damage by limiting electron exposure time. CLEM allowed the acquisition of reliable statistics and the investigation of the most common shapes of GLCs. In particular, a novel type of liquid cell was found, formed from only a single graphene film, greatly simplifying the fabrication process. The methods presented in this work—particularly the reproducibility and simplicity of fabrication—will enable future application of GLCs for high resolution dynamic imaging of biomolecular systems.

BRIEF DESCRIPTION OF THE DRAWINGS

The presently provided aspects will hereafter be more explained with further details and benefits with reference to the drawings showing a number of embodiments by way of example.

FIG. 1a illustrates a preparation of bottom film graphene supported by a porous polystyrene film on a TEM grid, in which:

a left-upper schematic image represents film deposition;
a middle-upper schematic image represents copper etching followed by scoop onto grid; and
a right-upper schematic image represents drying.

FIGS. 1b-1d illustrate methods for fabricating a graphene-water-graphene stack for the formation of liquid cells.

FIG. 1b illustrates loop-assisted graphene transfer (LAT) of graphene onto a graphene-coated TEM grid, sandwiching water between the two graphene films to form liquid cells.

FIG. 1c illustrates fabrication of liquid cells by the touch-down method, where a graphene-coated TEM grid is placed on an unsupported graphene film floating on water.

FIG. 1d illustrates fabrication of liquid cells by the sandwich method, where two graphene-coated TEM grids are placed on top of each other, sandwiching a droplet of water.

FIGS. 1f-1h illustrate quality of graphene transfer by the methods described in FIGS. 1b-1d.

FIG. 1f provides an optical microscopy image showing the graphene coverage on a paper background after transfer by the LAT method illustrated in FIG. 1b. Drawn line marks the edge of the graphene film. Scale bar: 1 mm.

FIG. 1g provides an optical microscopy image showing the graphene coverage after transfer by the touch-down method FIG. 1c. Red line marks the edge of the graphene film. Scale bar: 1 mm.

FIG. 1h shows an overlap of holey carbon support films that occurs on a sample prepared by the sandwich method FIG. 1d. Darker regions represent the support films that obscures most of the view, while the light holes represent the areas where only two graphene films are in the beam path and potential graphene liquid cells can form. Scale bar: 10 micrometer.

FIGS. 2a-2d are images of fluorescence-electron microscopy.

Figure 1:
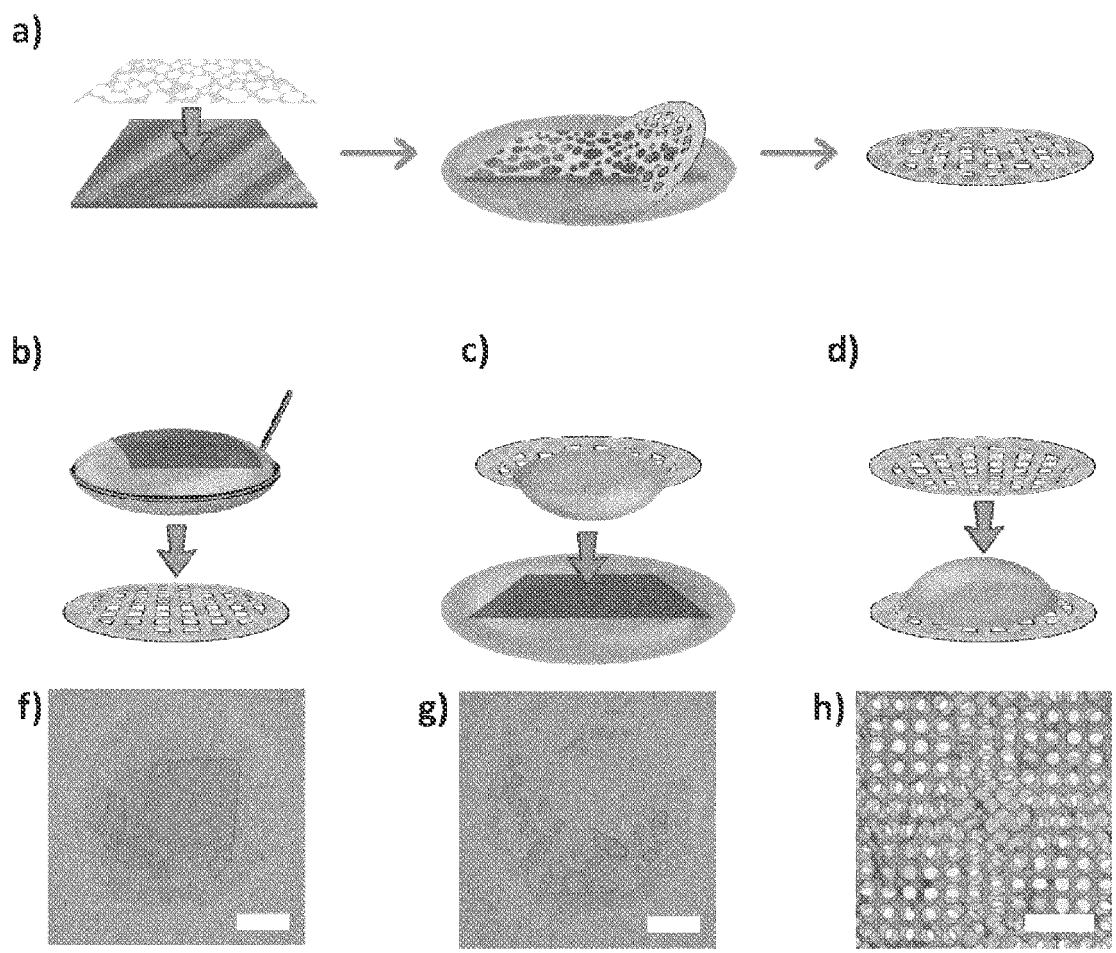
FIGS. 1a-1h provide a comparison of loop-assisted preparation of graphene liquid cells.
Figure 2:
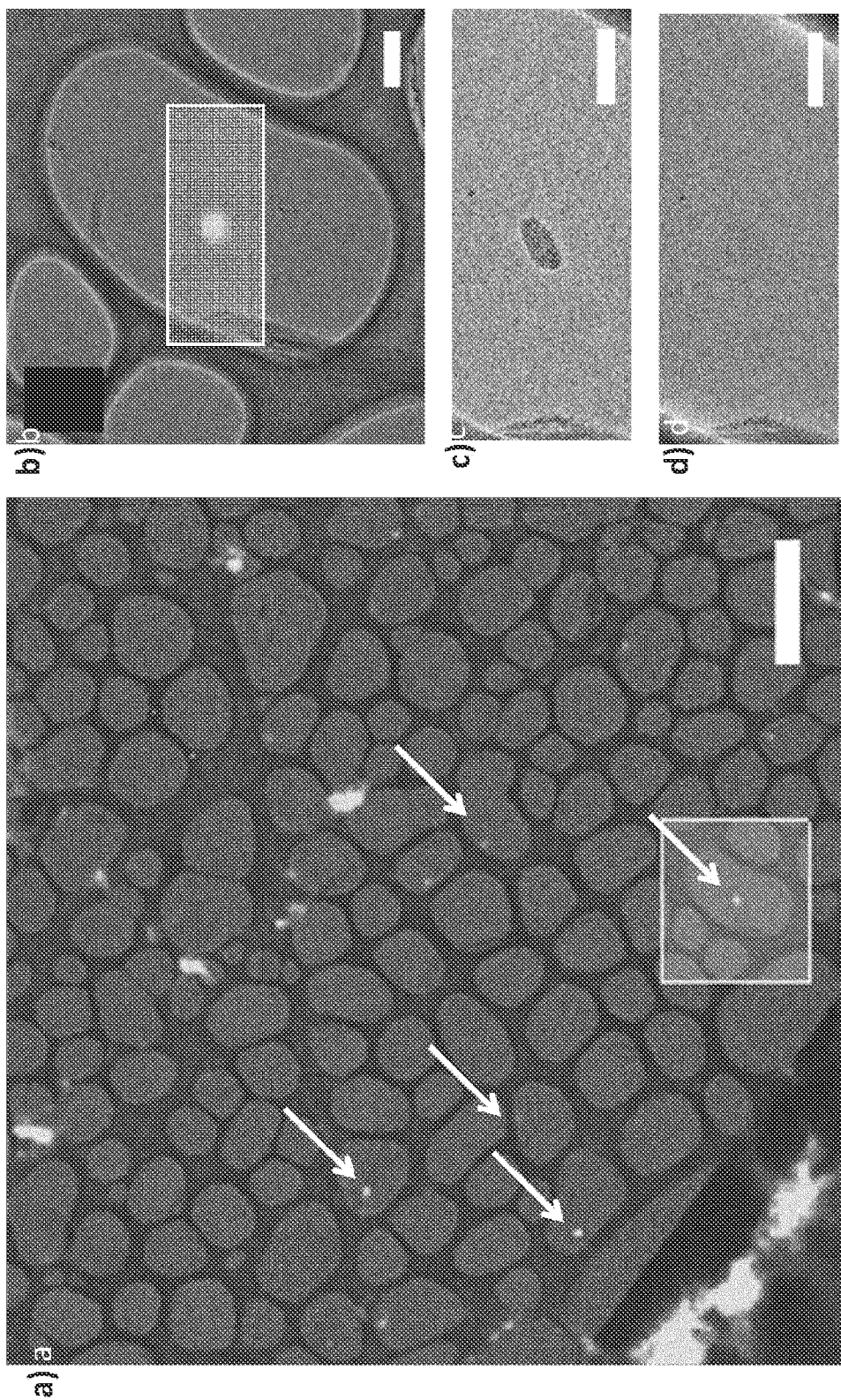

FIG. 2a is an overlay of a fluorescent microscopy image and a low magnification TEM image, correlated in MAPS software. In view is a TEM grid featuring graphene liquid cells fabricated through the loop-assisted transfer method. White arrows indicate fluorescent dots that were confirmed to represent liquid cells by transmission electron microscopy at higher magnification as shown in FIG. 1b through FIG. 1d. Scale bar: 10 micrometer.

FIG. 2b is an overlay of a fluorescent image and a high magnification electron image at of the white square in FIG. 2a, showing a single graphene liquid cell. Scale bar: 1 micrometer.

FIG. 2c is an electron image of the area indicated by the white square in FIG. 2b showing the darker contrast of a liquid cell. Scale bar: 500 nm.

FIG. 2d is the liquid cell in FIG. 2c after exposure to the focused electron beam. The contrast has disappeared, confirming that the content of the feature was liquid. Scale bar: 500 nm.

Figure 3:
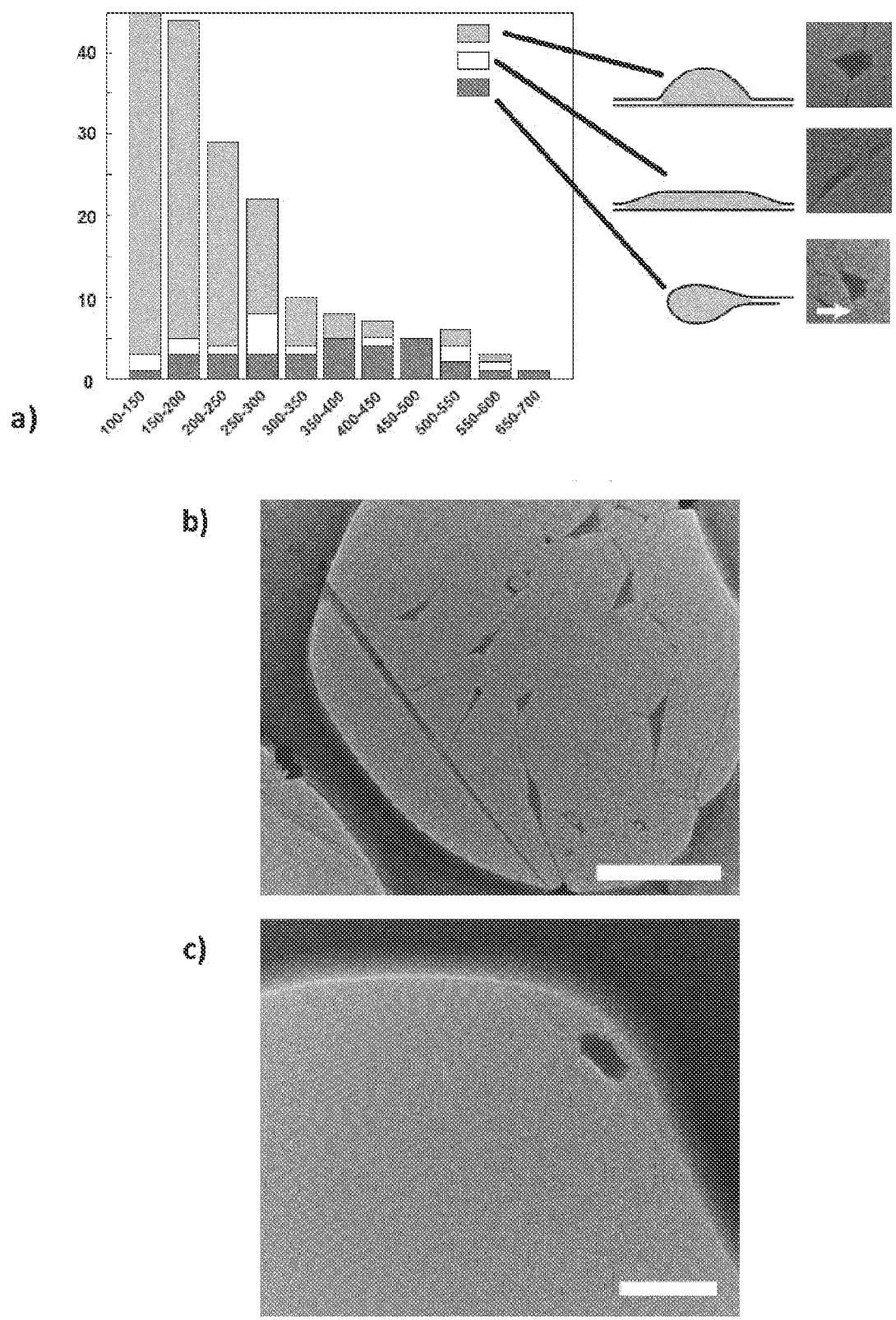

FIGS. 3a-3c illustrate three types of graphene liquid cells.

FIG. 3a illustrates a sum total occurrence of liquid cells sorted by type as a function of their size. The equivalent cell size is defined as the square root of the cell area and represented on a horizontal axis of a graph. The number of cells is represented on a vertical axis of the graph. Cell types:
  "pocket" represented in right upper images and marked gray in the graph,
  "crease" represented in right middle images and marked white in the graph, and
  "fold" represented in right lower images and marked dark-gray in the graph.
The white arrow in the right-most lower image indicates the edge of a graphene film where it folds back on itself.

FIG. 3b is a TEM image of a double film of graphene encapsulating a number of liquid cells of "pocket" and "crease" types. Scale bar: 500 nm.

FIG. 3c is a "fold" type graphene liquid cell encapsulated in a single film of graphene. Scale bar: 500 nm.

FIGS. 4a-4f illustrate gold nanoparticle formation in three cell types imaged by TEM.

Figure 4:
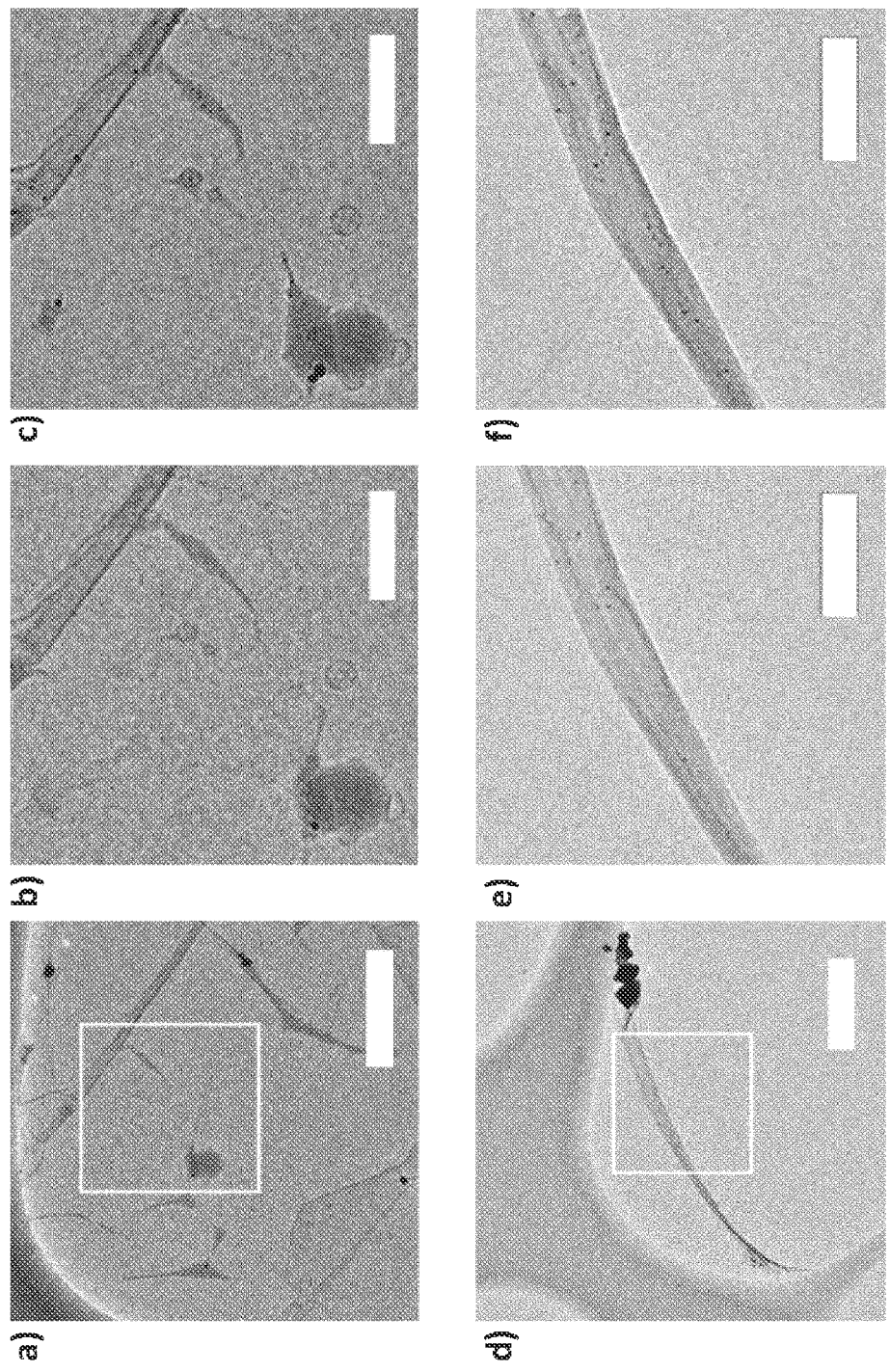

FIG. 4a illustrates a fold cell encapsulating $HAuCl_4$ solution at the start of beam exposure. Scale bar: 500 nm.

FIG. 4b is a zoomed-in area of the red square in (a). A few nanoparticles have already formed during initial beam exposure. Scale bar: 200 nm.

FIG. 4c illustrates the same area after 10 seconds of beam exposure of ~100 $e^- Å^{-2} s^{-1}$, during which Au nanoparticles have developed in the liquid phase. Scale bar: 200 nm.

FIG. 4d illustrates crease and pocket cells encapsulating $AuCl_3$ solution. Scale bar: 500 nm.

FIG. 4e is a zoomed-in area of the red square in (d). Scale bar: 200 nm.

FIG. 4f is the same area as in FIG. 4e after 4 seconds of beam exposure. Scale bar: 200 nm.

FIGS. 5a-5g illustrate bubble formation in fold and pocket cells imaged by TEM.

Figure 5:
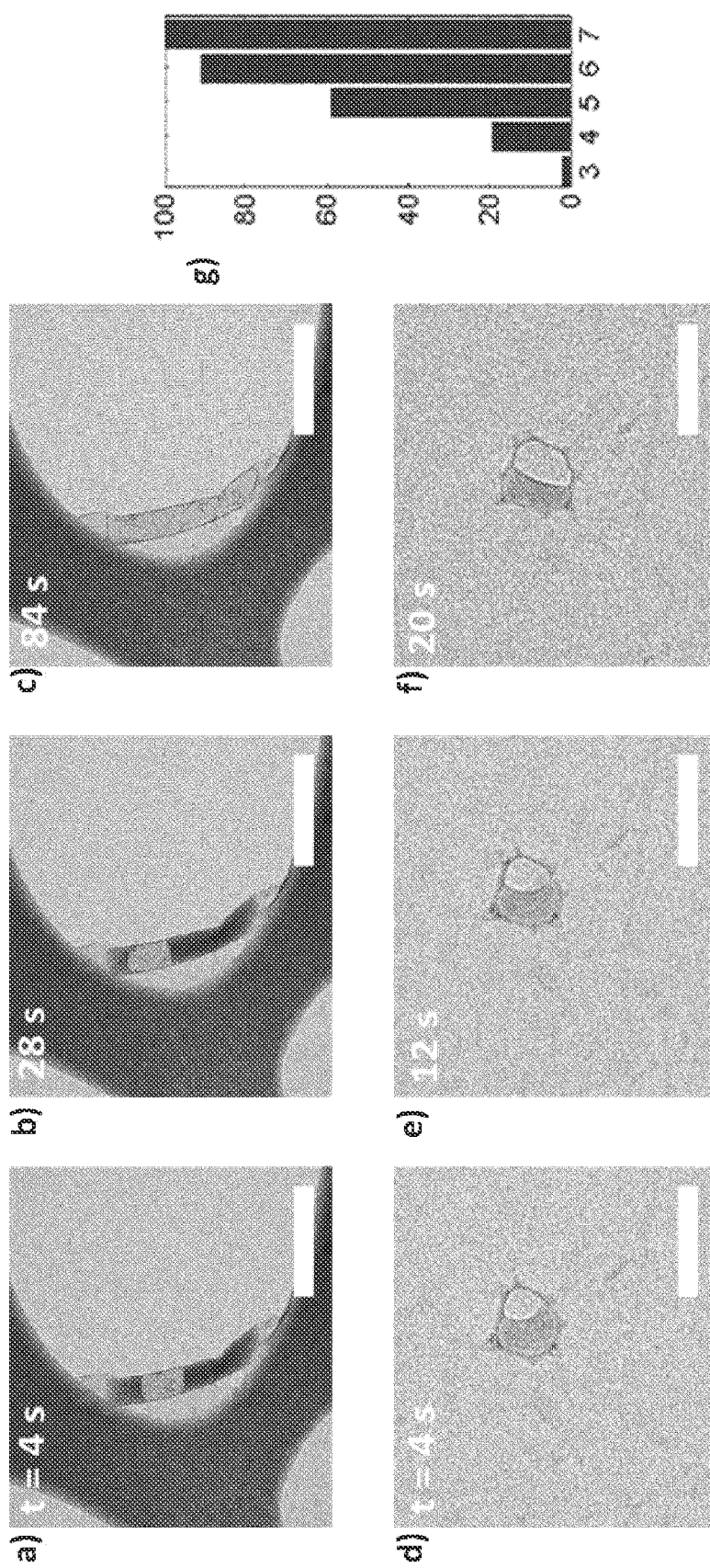

FIGS. 5a-5c illustrate bubble formation and expansion in a pocket cell. Within the first second of irradiation a bubble appears that grows under prolonged beam exposure. Scale bar: 500 nm.

FIGS. 5d-5f illustrate bubble formation and movement in a fold cell, followed by cell collapse Scale bar: 100 nm.

FIG. 5g is a graph of percentage of pocket cells where the onset of bubble formation was observed, represented on a vertical axis, correlated to the number of corners in the circumference of the cell, represented on a horizonal axis. The number of corners is a measure of the curvature of the graphene top film. A thickness and/or a volume of the cell may, also or alternatively, be derived from the shape of the circumference and/or the number of corners and a flexibility of the film, or from a measurement of the thickness itself.

DETAILED DESCRIPTION OF EMBODIMENT(S) OF THE INVENTION

Low Stress Graphene Transfer

FIG. 1 summarizes a procedure of graphene liquid cell fabrication. Single film graphene was grown on a copper substrate by chemical vapor deposition as an example of thin film formation on a substrate. In the case of the LAT and touch-down methods, GLCs are assembled on a TEM grid coated with a porous polystyrene film that gives support to the bottom graphene film (FIG. 1a, step I-IV). However, other supports than TEM grids and/or other additional support films than a porous polystyrene film may be used, however, a porous and/or grid or grid-like support is preferred, e.g., for reduction or prevention of hindering imaging. An exemplary description of fabrication of a polystyrene film is described in the Methods section elsewhere in this disclosure. A pore-to-support ratio can be varied by changing fabrication parameters, in some cases a 50:50 pore-to-support ratio may represent the largest area of open space while still yielding a stable support membrane. It has been found that polystyrene-supported grid preparation has proven more reliable than direct transfer onto support films attached to TEM grids. The success rate with which TEM grids may coated with polystyrene-supported graphene may exceed 98%. Such high yield may be attributed to the addition of the support film as flexible film onto the graphene-copper stack, resulting in very reliable adhesion of graphene to the film. Other types of support film may be provided.

FIG. 1b, left panel, shows a preferred method for the transfer of the second graphene film: the loop assisted transfer or LAT. The LAT method may be used for different thin films than graphene. In the method, a bare graphene film is provided freely floating on a liquid surface prior to transfer, e.g. on a water-air interface. According to the present concepts, graphene is transferred using a loop carrying a droplet of liquid, here: water, along with the floating graphene film onto the grid (FIG. 1b). The loop may have any suitable size and may be made of any suitable material. The loop may have an average diameter of less than 5 mm. For use with standard-sized TEM grids of about 3 mm diameter, a 2 mm diameter loop may be suitable. The loop may be of metal. In principle, the loop may be formed by any object that has a hole adapted to carry a droplet of liquid, in particular for LAT.

As the droplet is blotted by filter paper or otherwise excess liquid is removed and the grid is optionally left to dry, the top graphene film comes into contact with the bottom graphene film forming liquid cells between them. This approach is believed to induce little stress to the graphene film, resulting in a large area of intact graphene after transfer (FIG. 1f). An amount of liquid may remain on the sample. In an example using water as the liquid, drying of the last remaining water was recorded under an optical microscope. It was found that a thin film of water may remain suspended in holes of the support film, separating the two graphene films until the very last moment, when liquid cells form. It is noted here that the optional polystyrene support film could be otherwise of little influence on one or more of the formation, size or distribution of liquid cells observed in the experiments, here having little influence on all these features.

The bottom graphene film may preferably be a flat graphene film without noticeable wrinkles. The top graphene film may be flexible, at least at or near a moment of contact with the bottom film, wherein curvature and wrinkles could allow for the formation of liquid cells (FIG. 3b).

Thus, a method of fabricating thin film liquid cells may comprise bringing a thin film in contact with a target substrate in combination with a liquid, providing a curvature, a wrinkle and/or a fold in the thin film and capturing an amount of the liquid in the curvature, wrinkle or fold. The target substrate may be provided with a target thin film, and at least part of the amount of the liquid may be captured between the thin film and the target thin film. Also or alternatively, at least part of the amount of the liquid may be captured between opposing portions of the thin film associated with the curvature, wrinkle and/or fold.

The following Table 1 indicates the number of GLCs fabricated through different methods in representative examples in which GLC formation efficiency is compared with and comparative examples using two commonly reported methods of graphene liquid cell fabrication.

TABLE 1

Efficiency towards GLC formation of three fabrication strategies. All liquid cells counted (column 1) were confirmed by high magnification TEM imaging. The number of GLCs per grid (column 3) is an average and was extrapolated taking into account the area of the grid that was investigated on each grid prepared.

| | Total GLC count | Number of grids prepared | Extrapolated average number of GLCs per grid |
|---|---|---|---|
| Example: Loop-assisted transfer (LAT) | 184 | 21 | 300 |
| Comparative example: "Touch-down" transfer | 18 | 8 | 80 |
| Comparative example: TEM grid sandwich | 3 | 6 | ~1 |

The listed GLC count was obtained as described in the section on Methods.

FIG. 1c shows a result of the touch-down method. This method was found to result in fractured graphene patches that poorly covered the TEM grid. In this method, second graphene film is subject to mechanical stress during the deposition. Moreover, the interplay of surface tension between the two water phases (the droplet on the grid and the water underneath the second graphene film) causes local water turbulence. It has been found that for these reasons, the approach yields a highly ruptured and crumbled second graphene film, even if multilayer or monocrystalline graphene are used.

FIGS. 1f and 1g are microscopy images of graphene deposited by the LAT and, respectively, the touch-down method onto a white paper substrate. A comparison reveals the difference in surface coverage between both methods. Graphene film absorbs too little light to be visible against the polystyrene film on a TEM grid, the white paper was therefore chosen as background substrate to visualize the coverage of graphene by optical microscopy. Coverage and integrity of graphene after LAT and, respectively touch-down transfer were also investigated on a silicon oxide wafer.

FIG. 1d indicates a further method used for a comparative example. This method omits the transfer of a graphene film altogether, in that two graphene-coated TEM grids are sandwiched together with a droplet of water in between. Although this "grid-sandwich method" ensures mechanical support to both graphene films, results are poor. GLC formation is found to be hampered by the loss of flexibility caused by the porous support film that rigidly suspends both graphene films. On a total of six grids successfully sandwiched in the experiments, a total of three liquid cells were found. Besides low GLC count, it was found that the two holey support layers overlap in random orientation, so that most of the grid area is obscured by at least one support layer (FIG. 1h). GLCs that form suffer from contrast loss due to the support layer in the beam path.

Hence, it was found that loop-assisted transfer of a graphene film improves intactness of the graphene.

Fluorescent Labeling for Low Dose Sample Screening

GLCs tend to be very small compared to the size of a TEM grid. Therefore, GLCs and their contents are commonly exposed to the electron beam of a TEM during screening of the grid to locate GLCs. This is undesirable, as GLCs and their aqueous content are generally electron beam sensitive. Moreover, as liquid cells can be distributed sparsely over the grid, locating them at high magnification is a time-consuming task faced in all GLC experiments regardless of the GLC fabrication method. The same may hold, for other small objects and samples in TEM-microscopy, in particular for liquid cells.

Therefore, a method is herewith provided to locate liquid cells using light microscopy. The method comprises providing adding a low concentration of a fluorescent dye to the liquid, e.g., high quantum yield fluorescent dye (such as Atto 488, which may be used in concentrations as low as about 5-20 microMol, e.g., 10 µM) added to the water of the present experiments. For separation of, on the one hand, localization and/or identification of a liquid cell, and, on the other hand, one or more substances and/or processes in that liquid cell or otherwise associated with that liquid cell, it may be preferable that the dye or other luminescent substance does not react with and/or otherwise affect the one or more substances and/or processes in that liquid cell or otherwise associated with that liquid cell, which may include: does not react with and/or otherwise affect a portion of the thin film and/or support associated with that liquid cell.

FIG. 2a shows an optical microscopy image of a TEM grid featuring fluorescent-tagged GLCs. In FIG. 2a, some background fluorescence may be discerned which reveals the contours of the polystyrene support film, as polystyrene weakly fluoresces in the green spectral region. Other support films and/or support structures may or may exhibit different types of fluorescence and/or at other wavelengths. In some cases, luminescence effects may depend on illumination with different wavelengths and/or may occur on time scales (phosphorescence being a notable example).

FIG. 2b shows an overlay of the fluorescent image and an electron image at low magnification of the same grid. White arrows indicate liquid cells, of which one example is shown in FIG. 2c. Encapsulated liquid water may be proven by disappearance of the feature upon exposure to high electron doses, and its appearance as a small dot on fluorescent image. It is noted that, in case of using dye, a dye solution can dry out on the TEM grid outside of thin film encapsulation providing thin film liquid cells. This may result in bright spots on a fluorescent image which may be large compared to the thin film liquid cells. TEM images may reveal dry deposits of dye on such locations. Such type of dried out dye deposits may therefore be clearly distinguishable from dissolved dye encapsulated in GLCs. Although the method efficiently comprises relying on capturing light optical image data with a camera and capturing electron optical image data with a TEM, capturing light optical image data associated with a light optical aspect of at least part of a structure comprising the thin film and capturing electron optical image data associated with an electron beam optical aspect of at least part of a structure comprising the thin film and comparing said captured light optical image data and electron optical image data may be suitably employed, e.g., using transmission optical microscopy, phase contrast microscopy and the like and/or using reflectance optical microscopy. Comparing the types of image data may comprises overlapping and/or scaling and/or otherwise correlating different types of image data. As an example, in line with the foregoing, using correlated fluorescent-electron microscopy, an entire standard-sized TEM grid of about 3 mm diameter circular shape can be rapidly screened at a level of individual grid squares, which may amount to (100×100 µm$^2$), allowing direct identification of GLCs on the grid.

Characterizing Graphene Liquid Cells

GLCs created by the loop-assisted fabrication method show areas of high GLC density (FIG. 3b). In a series of examples of the type discussed above, thin film liquid cells using graphene were prepared on TEM grids. On each grid, an area of eight windows of 100×100 µm$^2$ was imaged to obtain a representative count of the GLCs on a grid. Over 21 thus prepared and studied grids, the average GLC density extrapolated to the total grid area was 300 liquid GLCs per grid—equivalent to one GLC per two grid squares. The size distribution of the identified GLCs is presented in FIG. 3a, showing that their frequency of occurrence drops with cell size. The cells size ranges up to 700 nm in lateral size, with a relatively high population at lower lateral sizes.

For an amount of liquid, here: water, to be encapsulated by a thin film, here: graphene, to form a thin film liquid cell, the thin film or films should provide an uninterrupted seal around the circumference of the liquid cell. It is considered that the probability of a leak in the seal increases with increasing cell circumference, which may explain the general trend of decreasing GLC frequency with increasing size. Thus, the present concepts facilitate formation of differently-sized liquid cells.

In the shown examples comprising a bottom film, which generally is stretched flat, the volume of a liquid cell is predominantly determined by the shape of the top thin film. The thin film should best be flexible during the last stage of deposition, when liquid cell formation occurs. This is, in particular, the case for graphene and for other atomic and molecular monolayers.

In the present examples, the dimensions of small liquid cells proved to go down to the point where a liquid cell can no longer be faithfully distinguished from an irregularity in the top graphene film (several examples can be seen in FIG. 3b). For simplicity and considering that liquid cells may need a particular volume to be of interest in further use and/or studies, GLCs with a lateral size smaller than 200 nm$^2$ are disregarded in the following discussion.

In total, ninety cells larger than 200 nm$^2$ were observed, resulting in an average of one GLC per two grid squares. Different types of thin film liquid cells were fabricated. In particular, three types of graphene liquid cells are presented in the panels of FIG. 3a and in FIGS. 3b and 3c. They include: I. "pocket" cells, wherein the amount of liquid is enveloped by a top film portion on a bottom substrate or bottom thin film in a roughly equilateral fashion; II. "crease" cells, wherein the amount of liquid is trapped in, possibly long, creases in at least one of the thin film portions encapsulating the amount of liquid, e.g., a top film; and III. "fold" cells, wherein a single film is folded back on itself, here a graphene thin film. Crease and/or fold cells may be readily made with a partly ruptured thin film.

In the examples, pocket cells may form the majority (e.g., about 70-80%) of GLCs. However, it is considered that depending on the method of manufacturing and in particular the quality and/or flexibility of the thin film(s) the relative number of cells may be caused to differ. The flexibility of the top thin film (or: top film portion) may play an important role in the formation of pocket cells: to accommodate for a volume of or for the amount of liquid, the flexible top film may curve or be made to curve around the volume. This may typically comprise folding into a discrete number of corners at or near a liquid cell edge. It is noted that such forming and/or folding may occur during evaporation or otherwise removal of liquid between the thin films, the removal possibly comprising blotting. The top middle panel in FIG. 3a shows a five-cornered pocket cell. In TEM images, relative thicknesses of liquid cells can be roughly estimated from a comparison of contrasts of liquid cells on a single TEM image. Such comparison may be only relative and hold if the beam settings are equal; it is to be noted that different measurement methods and/or image processing methods and/or associated apparatus may suitably be used alternatively or in addition. In the present examples, comparison was made between different liquid cells identified on the same image. A larger number of corners around a pocket cell generally accommodate a thicker pocket or in general a larger separation of top and bottom film portions which may (be made to) relate to larger volumes and/or larger amounts of liquid encapsulate. Generally, pockets of liquid encapsulated by Van der Waals surfaces such as graphene or other thin films show correlation between pocket size and height. In the present examples, three or four-cornered cells generally appear thinner than five or more-cornered cells of the same lateral size. The volume of a pocket cell is thus not strictly correlated to its projected size on a TEM image. Instead, it is found that the number of corners determines the curvature of the top film and thus the volume of a pocket GLC. Hence, a method of determining a volume of a liquid cell may comprise identifying a liquid cell, determining a circumference and a number of corners of the liquid cell and determining, based on the circumference and a number of corners a volume of the liquid cell and/or a an amount of liquid in the cell.

Crease type liquid cells may be formed in long bends or folds in at least one of two opposing thin films, possibly the top graphene film. In some experiments, crease type liquid cells may make up a minority of the liquid cells, e.g., about 10-15% of liquid cells, in particular in a size range >200 nm$^2$. A difference in structure between crease cells and pocket cells is highlighted in FIGS. 3b and 3c. As can be seen from the distribution in FIG. 3a, crease cells may be larger on average than pocket cells: depending on the nature, size and distribution of any creases, comparably long, straight walls may be provided in a creased thin film. Thus, the creased thin film may form a liquid-tight seal more easily over a greater length than a pocket cell for otherwise equal circumstances. Depending on how transfer of a thin film is done and/or depending on a structure of a support onto which the thin film is deposited, a number of creases in the thin film, e.g., in a top graphene film may be abundant or rather rare. In the latter case, crease cells may make up only a small percentage of liquid cells.

Fold cells are provided as a third type of thin film liquid cells, here again shown as a GLC type. In some of the examples, fold cells may make up a large minority of liquid cells, in particular in one or more size ranges, e.g., 25-40% of the cells in the size range of interest. Fold cells may be formed by folding over a portion of a thin film providing a first and a second thin film portion such that a volume for containing an amount of the liquid may be formed between the first and second portions of the thin film. E.g., fold cells may form where a bottom film of graphene is ruptured and folded back on itself (FIG. 3c). The formation of fold cells may obviate addition of a second thin film. E.g., in some of the experiments fold cells were fabricated during deposition of the first graphene film on the TEM grid. In other experiments fold cells were formed on grids bearing only one graphene film (that is, after step III in FIG. 1a).

Fold cells may readily encapsulate large volumes of liquid compared to the other cell types and fold type GLCs may be predominant in a size range from 250 to 400 nm (FIG. 3a). Furthermore, fold cells may be formed in case a single thin film, here, a graphene film is (partly) torn and (made to) fold or roll up on or against a support structure, e.g., the polymer support layer in the present examples. Since one side of a fold cell may be made up of a single continuous portion of the thin film, sealing of the first and second thin film portions along at part of the circumference of the cell primarily happens or may be made to happen on the remaining sides of the cell relative the fold side. Thus, fold cells may be provided with a cylindrical cross-sectional shape and may be thicker on average than pocket cells or crease cells, possibly also having a larger total volume.

The liquid cells provided according to the presently provided methods and considerations may be suitably employed for different goals, in particular (study of) nanoparticles and/or submicron-sized biological specimen. As an example of (use of) the presently provided techniques, efficacy of each liquid cell type towards imaging dynamic processes was studied. In particular, formation of nanoparticles (here: gold nanoparticles under electron irradiation) was studied for each liquid cell type. For some experiments, an aqueous solution of one or more precursor substances, here: $HAuCl_4$ was encapsulated in GLCs and exposed to an electron beam leading to the reduction of gold (IV) ions to metallic gold nanoparticles. In the experiments, GLCs were fabricated on TEM grids provided with a polymer support layer and a graphene target thin film, and using LAT for transfer of a second thin film, all as discussed above, fabricating predominantly GLCs of the pocket and crease cell types.

To load pocket and crease GLCs, a droplet of a 10 mM solution of $HAuCl_4$ was placed on the graphene thin film carrying TEM grid prior to transfer of the graphene top film by the LAT method with subsequent blotting of excess water and evaporation of remaining water. The formation of Au nanoparticles from $HAuCl_4$ solution was chosen as a test reaction because it is a well-documented procedure that has been extensively characterized in literature. After some time, ten seconds of beam exposure, nanoparticles of varying sizes had formed in all liquid cells, with high contrast regions being, indeed, pockets of encapsulated liquid (FIG. 4a-c).

As indicated above, in a similar experiment fold cells were fabricated without transfer of a graphene top film. Instead, an aqueous solution of $HAuCl_4$ as described above was flushed underneath the polymer layer—supported graphene film after Step II in FIG. 1a. The polymer-graphene stack was then scooped onto the TEM grid from the liquid surface (cf. Step III in FIG. 1a) forming fold cells, and encapsulating the $HAuCl_4$ solution in the fold cells. The latter, as is evidenced by gold nanoparticle formation (FIGS. 4d-f). The formation and loading of graphene liquid cells from a single thin film, in particular single film of graphene significantly facilitates manufacturing and use of thin film liquid cells compared to the techniques known to date, in which graphene liquid cells have always required the assembly of two graphene films. The size and number of fold cells may be regulated to some extent by varying a velocity and/or sideways motion of the TEM grid when scooping up the polymer-graphene stack. Likewise, instead and/or in addition to a polymer layer one or more other supports may be used, however preferably porous and/or another base support than a TEM grid, however preferably porous and/or grid-like as well.

GLCs Under the Electron Beam

Thin film liquid cells as provided herein may be used for different studies, both with respect to the cells themselves and with respect to the liquid contained therein. When irradiated by an electron beam such as in an Electron Microscope like a TEM, the liquid in the thin film liquid cells may undergo bubble formation. In FIG. 3b showing GLCs, a number of the GLCs have a low contrast region at their center where liquid water has been displaced, due to bubbles. In thin film liquid cells containing water the appearance of a bubble may be due to water splitting by radiolysis. E.g., when a hydrogen concentration in the liquid reaches a critical value, bubbles form which may be substantially instantaneous. Since the formation of a bubble inside (the liquid in) the liquid cell increases the volume of the encapsulated matter in the cell and therewith increases the pressure on the cell walls, the development of a bubble in GLCs is related to the stability of the seal formed by the thin film, in the present examples by the graphene. This enables study of the stability of the different cell types in terms of the observed bubble formation under relatively strong beam exposure.

FIG. 5a-5c show selected frames of a series of images of a fold cell under an electron beam exposure of 144 $e^-Å^{-2}s^{-1}$ accelerated to 120 keV. (Typically ~10 $e^-Å^{-2}s^-$ at 1-2 seconds exposure time is used for high resolution imaging of single particles); note that higher or lower beam exposures (doses and/or acceleration energies) may be used, e.g., dependent on the nature of the liquid within the cells and/or the thin film material in relation to the electron beam parameters. In the frame-series, already on the first frame a region of light contrast, representing a bubble, has appeared. During live observation of many liquid cells, liquid cells may be observed to contain generally no bubbles during the first moment of beam exposure, but under the strong beam conditions used bubble formation proceeds rapidly and may be too rapid to capture a bubble-free GLC. From the first frame on, one or more bubbles may be found to move around the available space in the liquid cell in which it/they form, until the cell content disappears substantially completely. This may be understood as liquid escaping into vacuum within the electron beam microscope, possibly due to damage induced by the electron beam to the graphene film. Such behavior is also considered to occur in thin film liquid cells of the fold cell kind with other thin films.

Similarly, FIG. 5d-5f show selected frames of a pocket cell GLC. Again, a bubble has formed during a first instance of electron beam exposure, although more bubbles may possibly be formed. However, unlike the fold cell, dark contrast remains present in the pocket cell even after extended exposure to a relatively strong electron beam. For a bubble to nucleate and form an equilibrium with remaining liquid water, evidently the sealing between the two graphene films around pocket cells results in very leak-resistant encapsulation. In FIG. 3b, various pocket cells are shown to have undergone bubble formation, whereas others retain uniform dark contrast after prolonged beam exposure, which is indicative of no bubble formation. This was a general trend observed in all pocket cells. FIG. 5g graphs the percentage of pocket cells that did show collapse under beam exposure, revealing a strong correlation to the number of corners—and thus the curvature of cells. A possible explanation is that, in few-cornered cells, the close-to-flat graphene films do not allow for the increase in volume required for bubble formation and the GLC is extremely stable.

Over all, the stability and leak-resistance of pocket cells makes them favorable candidates for future applications. Fold cells are evidently more weakly sealed than pocket cells. Even so, the larger volume and unmistakable dynamic liquid content lend themselves very well to encapsulation of larger, macromolecular specimen. Moreover, the ease of fabricating the single graphene film required to form fold cells compared to requiring two thin films is an obvious advantage.

Methods

In the following, different method steps are discussed in more detail, as examples and/or providing further information to the discussion of examples above. In any example, also if not explicitly indicated, numerous options and/or alterations may suitably be selected and beneficially employed within the concepts presented herein and/or the subject matter claimed.

Preparation and Handling of Graphene for GLC Fabrication

Although other methods may be used and/or provided, for the shown examples of graphene liquid cells, graphene was grown onto copper foil by chemical vapor deposition in a tube oven, but other substrates could be used. To obtain a copper foil featuring graphene on only one side of the foil, one side of the copper foil was protected, here by a glass slide taped around the etches of the copper foil. As an option, graphene on the other side of the copper was then removed.

A suitable manner proved exposure to oxygen plasma (e.g., 2 mins, 160 Watt), rendering a copper foil with a single graphene film.

Optional support films may be porous and be made from any suitable material. For the examples shown and discussed above, an example, porous polymer support films were made. These films were made from a solution of 0.3-1% e.g., about 0.5% polystyrene (average Mw 192,000) in ethyl acetate; different concentrations could be used. Ten volume-percent of glycerol (≥99.0%) was added to form a biphasic mixture. Shaking the mixture thoroughly for one minute created a dispersion of glycerol in polystyrene solution. Amongst others, the duration and/or vigor of shaking may govern one or more properties of the dispersion and thus affect the size and/or the density of pores in the polymer film. The dispersion was applied onto a substrate; e.g., a glass slide was then dipped in the dispersion and lifted out, forming a porous polystyrene film on the glass surface. As an option, the film was cleaned away from one side of the glass slide. At least part of the film, e.g., the remaining film on the other side of the glass substrate, was then lifted off from the glass slide by slowly dipping the glass slide into ultrapure water, rendering the polystyrene film floating on water. Thus, prepared polystyrene porous films could be made thin e.g., to a thickness of well below 1 micrometer, e.g., below 100 nm such as 20-50 nm, in particular 30±5 nm, which could be confirmed by atomic force microscopy on the film deposited on a silicon wafer if so desired.

For samples, graphene on copper, e.g., fabricated as described above was cut out to form 3 mm circular-shaped pieces, although other shapes and/or sizes could be used. For samples comprising a (porous) support layer, the thus-formed pieces were placed onto a polymer film as described above on water, preferably so that the graphene side was in contact with the polymer film. The pieces were then picked up from the surface of water, while the polystyrene film adhered to the graphene-cooper flake. After optional drying in air, the pieces were placed copper-face down on an etching solution, e.g., 0.1 M aqueous solution of ammonium persulfate (APS, 98%) to etch the copper. When the copper was removed, the APS solution was replaced with ultrapure water by slow pumping to prevent surface vibration that might damage the graphene film. The graphene-polystyrene stacks were then scooped onto a gold TEM grid (optionally rendered hydrophilic, e.g., by 2 minutes oxygen plasma exposure), resulting in porous polystyrene-supported graphene TEM substrates.

To form liquid cells, in particular of the pocket cell and/or crease cell types, a second film of graphene was transferred onto the graphene-polystyrene covered TEM substrates. To obtain free-floating graphene ready for transfer, 3 mm diameter pieces of graphene-on-copper were placed, without additional support layer discussed above, onto the surface of an etching solution, e.g., a 0.1 M APS etching solution as discussed above. An optional floating plastic frame, optionally provided with a hole which could be round or have another shape was used to stabilize the graphene during copper etching. The copper was then etched, e.g., by overnight etching at 4° C. The etching solution was then replaced with ultrapure water by slow pumping, after which the graphene was transferred onto the TEM grid substrate using one of the transfer methods described above.

Graphene Liquid Cell Count

To obtain a representative count of GLCs on grids fabricated via the three transfer methods (grid sandwich method, touch-down method and LAT), exemplary grids were screened using transmission electron microscopy. On grids with high GLC density (>1 GLC per grid square of 100×100 µm²) at least eight grid squares were inspected to obtain an estimate of the respective GLC density. On grids were the liquid cell density was low (<1 GLC per grid square of 100×100 µm²) a larger grid area was inspected to obtain a reliable estimate of the GLC density.

For the grid-sandwich method, graphene on a support film was procured from a commercial provider instead of manufactured as set out above. A flat surface is considered required for GLC formation to succeed according to this grid-sandwich method. Out of twenty attempts, six grid-sandwiches were successfully assembled (30%). Failed attempts were typically due to misalignment of the two grids at the moment the two grids made contact. Misaligned stacks were unusable as they do not fit in the sample holder of the electron microscope. Of the six successful stacks, liquid cells were found on only one (~15%). The overall liquid cell count over these six grids was three, although these cells were partially or completely located on the carbon support film, not on free-standing graphene.

For the touch-down method, top-film graphene deposition was successful on eight out of twelve attempts (66%). Failure was typically due to graphene drifting away from the grid the moment the grid was touched down, with the graphene film breaking into pieces or crumbling so that the attempt at deposition could be repeated. During inspection of the eight grids, GLCs were found on two grids (25%), with a total of eighteen observed liquid cells on these two grids.

For the LAT method, twenty one out of twenty four attempted graphene depositions were successful (88%). Failure was typically due to collapse of the water droplet in the loop. Of the twenty one grids, GLCs were observed on nineteen grids (90%). The total GLC count was 184 on these twenty one grids.

Fluorescent Light Microscopy

Fluorescent labeling of GLCs was achieved by depositing a luminescent-containing liquid, onto the TEM grid coated with graphene and the porous support polymer, e.g. a small (e.g., about 5-15 microliter such as about 10 µl) droplet of a dye-containing liquid such as a 10 mM aqueous solution of "Atto 488" fluorescent dye (≥98%), although numerous dyes may be employed. The top graphene film was then deposited; in case of deposition via the loop-assisted transfer method, the dye solution was allowed to mix with the droplet carrying graphene in the loop, e.g., a ~2 µl droplet of ultrapure water. Fluorescent light microscopy was performed on with an optical microscope to provide light optical image data. Thereafter the thus-prepared samples where imaged in a transmission electron microscope and electron image data was captured, see below. The captured image data comprised camera images and the data were correlated using image processing software.

Electron Microscopy

In the examples, different electron microscopes were selected for obtaining cell size statistics and for imaging of single liquid cells. In each case, GLC TEM grids were prepared and within 48 hours after preparation inserted in the respective electron microscope. The collection of cell size statistics was performed at 100 kV. Low-dose high-resolution imaging of single liquid cells was performed on a microscope operated at an acceleration voltage of 200 kV to minimize interaction of the beam with the sample. Electron image data was captured as images recorded with a camera.

Summarizing the foregoing, the preparation of graphene liquid cells tend to require relatively large films of intact single film graphene to be transferred without supporting layers. Herein, a reproducible approach is presented that yields large, even millimeter-sized, single layer graphene films onto a support, which may be a previously graphene-coated TEM grid. As liquid cell formation tends to occur randomly over the grid, a correlated fluorescent light-electron microscopy technique is provided to locate GLCs on the grid prior to exposure to the electron beam, which may be aided by fluorescent dye-tagging of the GLCs. Three types of GLCs may be caused to form by the described techniques, each type likely having a typical size distribution and stability. The morphology of a seam between two opposing thin films may be a determining factor in the stability of encapsulation. In particular, fold type cells may be formed in places where a thin film, in particular a ruptured graphene film folds and/or curls up, capturing water. Because of such formation process, only a single film of graphene is required instead of two layers and such fold cells tend to have a relatively large probability of encapsulating a relatively large volume of liquid compared to other types of liquid cells, typically dominating the size range between 250 and 400 nm, making them suitable for encapsulating macromolecular assemblies in the quest for development of GLCs for real-time imaging of liquid-phase biological systems. The demonstration of correlated light-electron microscopy "CLEM", in particular, allows the development of protocols for automated data-collection, targeting positions on the grid that were identified by fluorescence for electron image recording. Not only allows this preventing beam damage prior to imaging, it may also up the possibility of automated data collection on liquid-phase samples and to recording tomography images as are currently widely used to generate 3D reconstruction of cryogenic samples.

The disclosure is not restricted to the above-described embodiments which can be varied in a number of ways within the scope of the claims. Further, elements and aspects discussed for or in relation with a particular embodiment may be suitably combined with elements and aspects of other embodiments, unless explicitly stated otherwise.

The invention claimed is:

1. A method of fabricating a thin film liquid cell suitable for transmission electron microscopy at room temperature, comprising:
preparing a thin film that is floating on a liquid;
transferring a droplet of the liquid with the thin film floating thereon to a support by means of a loop, the loop carrying the droplet and the droplet carrying the thin film during the transferring; and
removing sufficient liquid from the droplet on the support to form the thin film liquid cell.

2. A method according to claim 1, wherein the thin film liquid cell is formed by a portion of the thin film that folds and comes into contact with another portion of the film while encapsulating liquid from the droplet.

3. A method according to claim 1, wherein the support is provided with a further thin film, whereby the thin film liquid cell is formed by liquid from the droplet getting confined between the thin film that was floating on the droplet and the further thin film provided on the support.

4. A method according to claim 3, wherein the further thin film is present on a porous film that is placed on the support.

5. A method according to claim 4, wherein the porous film comprises polystyrene.

6. A method according to claim 4, wherein the porous film has a thickness that is less than 100 nm.

7. A method according to claim 1, wherein the loop carrying the droplet has an average diameter of less than 5 mm.

8. A method according to claim 1, wherein the support comprises a grid for transmission electron microscopy.

9. A method according to claim 1, wherein preparing the thin film that is floating on the liquid comprises:
   forming the thin film on a substrate;
   placing the substrate with the thin film thereon on a surface of an etching liquid, whereby the substrate contacts the etching liquid;
   letting the substrate be removed by the etching liquid; and
   replacing the etching liquid by the liquid on which the thin film should be floating.

10. A method according to claim 1, wherein the thin film is composed of at least one layer that is a two-dimensional structure of at least one of the following: atoms and molecules.

11. A method according to claim 10, wherein the thin film comprises graphene so as to form a graphene liquid cell.

12. A method according to claim 1, wherein the thin film liquid cell is made to comprise a luminescent substance.

13. A method of imaging a sample comprising a thin film liquid cell obtained by a method according to claim 1, wherein the sample is imaged by means of a transmission electron microscope.

14. A method of imaging a sample according to claim 13, comprising:
   optical imaging of the sample so as to locate the thin film liquid cell in the sample; and
   electron imaging of the sample targeted on where the thin film liquid cell is located,
   wherein the thin film liquid cell is made to comprise a luminescent substance.

15. A thin film liquid cell suitable for transmission electron microscopy at room temperature, the thin film liquid cell being formed by a portion of a single thin film that has folded and that has come into contact with another portion of the single thin film thereby encapsulating liquid.

* * * * *